(12) United States Patent
Freer et al.

(10) Patent No.: US 10,371,576 B2
(45) Date of Patent: Aug. 6, 2019

(54) INFRARED SENSOR ARRAY CIRCUIT BREAKER MONITORING

(71) Applicant: Cooper Technologies Company, Houston, TX (US)

(72) Inventors: Benjamin Avery Freer, Syracuse, NY (US); Stephan P. Iannce, Clay, NY (US); Joseph Michael Manahan, Manlius, NY (US); Rick Rothenberger, Syracuse, NY (US); John Bonaccio, Dewitt, NY (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 402 days.

(21) Appl. No.: 14/867,745

(22) Filed: Sep. 28, 2015

(65) Prior Publication Data

US 2017/0089763 A1    Mar. 30, 2017

(51) Int. Cl.
*G01J 5/00* (2006.01)
*G01J 5/10* (2006.01)
*G01R 19/00* (2006.01)
*H04N 5/33* (2006.01)
*H04N 7/18* (2006.01)
*G01R 31/308* (2006.01)

(52) U.S. Cl.
CPC ............. *G01J 5/0096* (2013.01); *G01J 5/10* (2013.01); *G01R 19/0092* (2013.01); *H04N 5/33* (2013.01); *G01J 2005/106* (2013.01); *G01R 31/308* (2013.01); *H04N 7/183* (2013.01)

(58) Field of Classification Search
CPC .................................. G01J 5/0096; G01J 5/10

USPC ........................................................... 348/82
See application file for complete search history.

(56) References Cited

U.S. PATENT DOCUMENTS 7,989,769 B2    8/2011   Brandt et al.
8,324,907 B2    12/2012  Ziegler
8,569,684 B2    10/2013  Olson et al.
(Continued)

FOREIGN PATENT DOCUMENTS

JP    2011-179828 A    9/2011

OTHER PUBLICATIONS

International Search Report and Written Opinion from Corresponding Application No. PCT/US2016/050042; dated Dec. 22, 2016.
(Continued)

*Primary Examiner* — Jeffery A Williams
(74) *Attorney, Agent, or Firm* — Pearne & Gordon LLP (57) ABSTRACT

A thermal monitoring system includes at least one of an infrared sensor and a plurality of infrared sensors arranged in an array. Each infrared sensor has a resolution including a plurality of pixels. A controller is configured to create a thermal image of an area to be monitored based at least in part on the plurality of pixels of each infrared sensor. A thermal monitoring assembly includes an electrical panel including a plurality of electrical components located within the electrical panel. The at least one of an infrared sensor and the plurality of infrared sensors arranged in an array, either alone or in combination with additional sensors, are located inside the electrical panel. Methods of monitoring various parameters including a temperature of the plurality of electrical components located inside the electrical panel are also provided.

20 Claims, 8 Drawing Sheets

(56) References Cited

U.S. PATENT DOCUMENTS

| | | | |
|---|---|---|---|
| 9,064,394 B1* | 6/2015 | Trundle | G08B 13/19684 |
| 2006/0289726 A1 | 12/2006 | Paulus et al. | |
| 2009/0101821 A1 | 4/2009 | Masafumi | |
| 2010/0044567 A1* | 2/2010 | Brandt | G01J 5/0096 |
| | | | 250/334 |
| 2010/0169030 A1* | 7/2010 | Parlos | G01H 1/00 |
| | | | 702/58 |
| 2011/0280281 A1 | 11/2011 | Kennedy | |
| 2012/0170612 A1 | 7/2012 | Pompei | |
| 2013/0050778 A1* | 2/2013 | Stowe | G02B 27/1046 |
| | | | 358/475 |
| 2013/0138371 A1 | 5/2013 | Kennedy et al. | |
| 2013/0230074 A1 | 5/2013 | Shin | |
| 2013/0235901 A1* | 9/2013 | Shin | G01J 5/0025 |
| | | | 374/121 |
| 2013/0250102 A1* | 9/2013 | Scanlon | H04N 5/33 |
| | | | 348/143 |
| 2013/0258010 A1 | 9/2013 | Scanlon et al. | |
| 2015/0168470 A1* | 6/2015 | Dougherty | G01R 31/021 |
| | | | 702/130 |
| 2015/0338315 A1* | 11/2015 | Manahan | G01M 99/008 |
| | | | 702/183 |
| 2017/0034455 A1* | 2/2017 | Mattinson | H04N 5/33 |

OTHER PUBLICATIONS

"Thermal imaging for automation/process control"; FLIR Brochure; pp. 1-35.

* cited by examiner

INFRARED SENSOR ARRAY CIRCUIT BREAKER MONITORING

FIELD

This application relates to thermal monitoring systems and assemblies. More particularly, at least one of an infrared sensor and a plurality of infrared sensors arranged in an array are employed either alone or in combination with one or more additional sensors in an electrical panel. The infrared sensor, the plurality of infrared sensors, and the one or more additional sensors are configured to monitor various parameters including a temperature of electrical components within the electrical panel.

BACKGROUND

Infrared sensors can be used in a variety of applications to measure infrared light radiating from objects within a field of view of the infrared sensor. For example, objects emit heat energy in the form of radiation, and infrared sensors can detect infrared wavelengths radiating from the object. The heat energy can indicate a temperature of the object as well as a change, such as an increase or a decrease in a temperature, of the object or a part of the object. In some instances, electrical components (e.g., circuit breakers) may experience changes in temperature that are detectable by measuring infrared wavelengths radiating from the components. A thermal monitoring system and assembly, including a plurality of infrared sensors arranged in an array, are provided and are configured to monitor and detect temperature and changes in temperature.

SUMMARY

The following presents a summary of the disclosure in order to provide a basic understanding of some example aspects described in the detailed description.

In a first aspect of the disclosure, a thermal monitoring system includes an infrared sensor having a resolution including a plurality of pixels. The thermal monitoring system also includes a controller configured to create a thermal image of an area to be monitored based at least in part on the plurality of pixels of the infrared sensor.

In one example of the first aspect, the thermal monitoring system includes an additional sensor including at least one of a current transformer and an ambient temperature sensor configured to respectively determine at least one of a current and an ambient temperature with respect to the area to be monitored The infrared sensor is arranged inside an electrical panel, and the area to be monitored includes an electrical component located within the electrical panel. In another example, the thermal monitoring system includes a plurality of infrared sensors arranged in an array. Each of the plurality of infrared sensors has a resolution including a plurality of pixels. The area to be monitored includes an entire area within the electrical panel including a plurality of electrical components located within the electrical panel. The controller is configured to create a thermal image of the entire area to be monitored based at least in part on the plurality of pixels of each of the plurality of infrared sensors.

The controller is further configured to digitally overlay the thermal image onto a visual representation of the area to be monitored. The visual representation of the area to be monitored includes at least one of a picture of the area to be monitored, a wireframe drawing of the area to be monitored, a block diagram of the area to be monitored, and a photograph of the area to be monitored. The visual representation of the area to be monitored is stored electronically within a memory of the controller, and the controller is configured to access the visual representation of the area to be monitored from the memory and digitally overlay the thermal image onto the visual representation of the area to be monitored to produce a composite thermal map of the area to be monitored.

In addition, the controller is configured to map each of the plurality of pixels the infrared sensor to a corresponding plurality of points. Each of the corresponding plurality of points is located within the area to be monitored. The infrared sensor is configured to determine a temperature at each of the corresponding plurality of points. The controller is configured to create a thermal map of the area to be monitored based at least in part on the temperature at each of the corresponding plurality of points.

The first aspect can be provided alone or in combination with one or any combination of the examples of the first aspect discussed above.

In a second aspect of the disclosure, a thermal monitoring assembly includes an electrical panel including a plurality of electrical components located within the electrical panel and a plurality of infrared sensors arranged in an array. Each of the plurality of infrared sensors has a resolution including a plurality of pixels. The array is located inside the electrical panel. The thermal monitoring assembly also includes an additional sensor located inside the electrical panel configured to determine additional data with respect to an area to be monitored. A controller is configured to map each of the plurality of pixels of each of the plurality of infrared sensors to a corresponding plurality of points. Each of the plurality of infrared sensors is configured to determine a temperature at each of the corresponding plurality of points, and each of the corresponding plurality of points is located within the area to be monitored. The area to be monitored is located inside the electrical panel and includes the plurality of electrical components. The controller is further configured to determine a characteristic of the electrical panel based at least in part on the temperature and the additional data.

In one example of the second aspect, the additional sensor is at least one of a current transformer configured to measure a current of the plurality of electrical components and an ambient temperature sensor configured to measure an ambient temperature with respect to the area to be monitored. The controller is further configured to at least one of report and analyze the characteristic to at least one of diagnose and predict at least one of a status or problem of the electrical panel.

In another example, the controller is configured to create a thermal image of the area to be monitored based at least in part on the temperature at each of the corresponding plurality of points. The controller is configured to associate the temperature at each of the corresponding plurality of points with the area to be monitored, and the controller is configured to create a composite thermal map including the thermal image and a visual representation of the area to be monitored. The visual representation of the area to be monitored includes a visual representation of the electrical components, and the controller is configured to create the composite thermal map by digitally overlaying the thermal image onto the visual representation of the electrical components.

The thermal monitoring assembly also includes a monitor and the controller is configured to at least one of display the thermal image on the monitor and identify the characteristic on the monitor. The electrical panel includes a door configured to selectively provide and restrict access to an interior of the electrical panel. The array is arranged on at least one of the door and a frame structure inside the electrical panel such that each of the plurality of infrared sensors faces the interior of the electrical panel when the door is arranged to restrict access to the interior of the electrical panel. The thermal monitoring assembly can be configured to determine a position of the door with respect to the interior of the electrical panel.

The second aspect can be provided alone or in combination with one or any combination of the examples of the second aspect discussed above.

In a third aspect of the disclosure, a method of monitoring a temperature of a plurality of electrical components located inside an electrical panel includes providing a plurality of infrared sensors arranged in an array inside the electrical panel. Each of the plurality of infrared sensors has a resolution including a plurality of pixels. The method further includes mapping each of the plurality of pixels from each of the plurality of infrared sensors to a corresponding plurality of points. Each of the corresponding plurality of points is located within an area to be monitored, and the area to be monitored is located inside the electrical panel and includes the plurality of electrical components.

In one example of the third aspect, the method includes determining a temperature at each of the corresponding plurality of points and creating a thermal image of the area to be monitored based at least in part on the temperature at each of the corresponding plurality of points. The method further includes providing an additional sensor inside the electrical panel, where the additional sensor is configured to determine additional data with respect to the area to be monitored. In another example, the method includes creating a composite thermal map of the area to be monitored including digitally overlaying the thermal image onto at least one of a picture of the area to be monitored, a wireframe drawing of the area to be monitored, a block diagram of the area to be monitored, and a photograph of the area to be monitored. The method also includes identifying at least one of the plurality of electrical components in the composite thermal map based at least in part on at least one of the temperature of at least one of the corresponding plurality of points and the additional data.

The third aspect can be provided alone or in combination with one or any combination of the examples of the third aspect discussed above.

It is to be understood that both the foregoing general description and the following detailed description present embodiments of the present disclosure, and are intended to provide an overview or framework for understanding the nature and character of the embodiments as they are described and claimed. The accompanying drawings are included to provide a further understanding of the embodiments, and are incorporated into and constitute a part of this specification. The drawings illustrate various embodiments of the disclosure and, together with the description, serve to explain the principles and operations thereof.

BRIEF DESCRIPTION OF THE DRAWINGS

These and other features, aspects, and advantages of the present disclosure are better understood when the following detailed description is read with reference to the accompanying drawings, in which.

DETAILED DESCRIPTION

The following presents a description of the disclosure; however, aspects may be embodied in many different forms and should not be construed as limited to the embodiments set forth herein. Furthermore, the following examples may be provided alone or in combination with one or any combination of the examples discussed herein.

Figure 1:
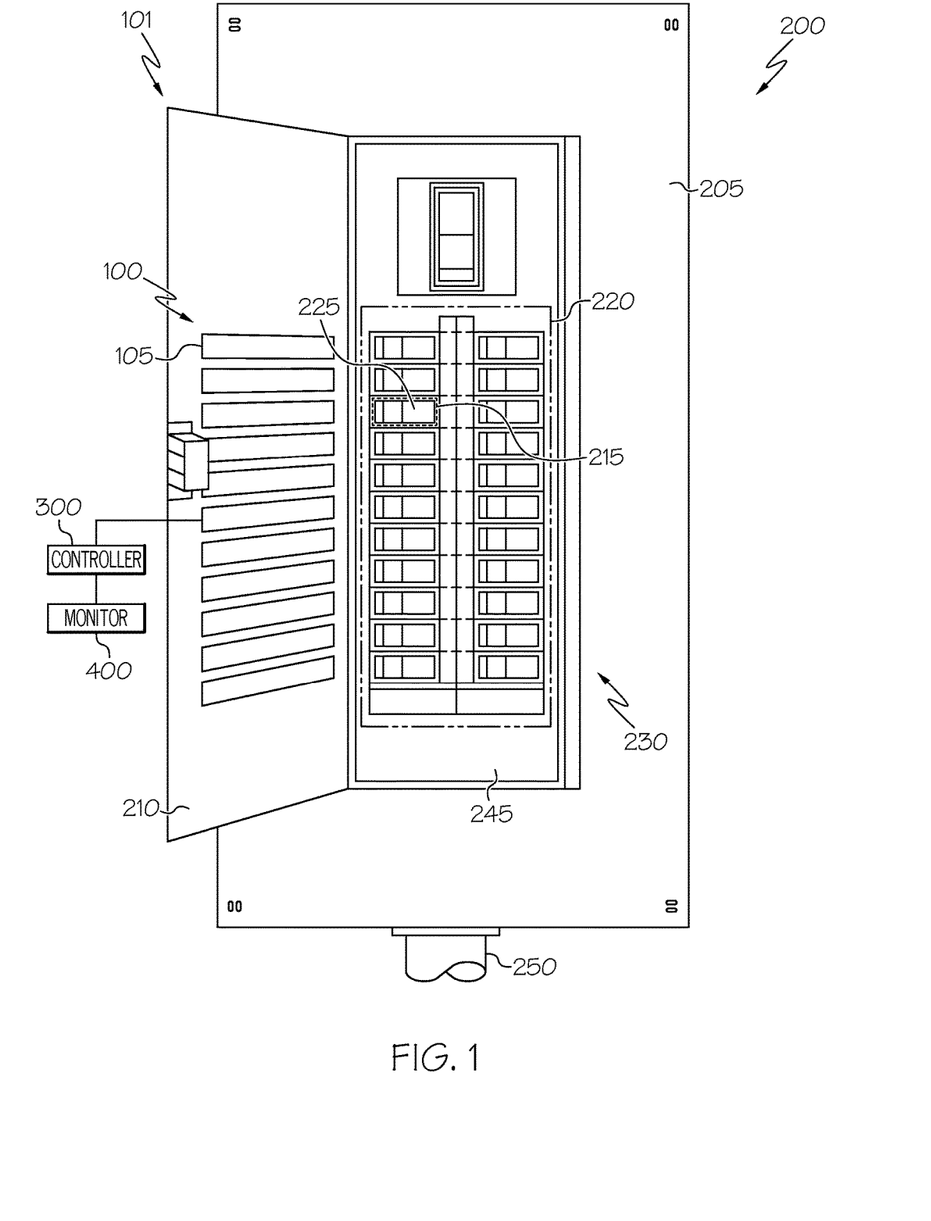
FIG. 1 is an illustration of an example thermal monitoring assembly arranged in an electrical panel in accordance with embodiments described herein.

As shown in FIG. 1, a thermal monitoring assembly 101 includes a thermal monitoring system 100 arranged inside an electrical panel 200. The electrical panel 200 includes a cabinet 205 that houses a plurality of electrical components 230 (e.g., circuit breakers, wires, transistors, diodes, receivers, circuits, semiconductors, resistors, capacitors, transducers, antennas, terminals, connectors, cables, switches, and any other electrical or mechanical components or devices). The electrical panel 200 can include a connection point 250 configured to provide input and out connection to and from the electrical panel 200, respectively. For example, the electrical panel 200 can be connected to a main power source (e.g., input connection) and distribute the main power to various components connected to the electrical power (e.g., output connection or connections).

In addition, the electrical panel 200 can include a door 210 configured to selectively provide and restrict access to an interior 245 of the electrical panel 200. As shown, and as further detailed in FIG. 2, the array 105 can be arranged on the door 210, either permanently or releasably detachable, such that each infrared sensor 115 of the plurality of infrared sensors 110 faces the interior 245 of the electrical panel 200 when the door 210 is arranged to restrict access to the interior 245 of the electrical panel 200 (e.g., when the door 210 is closed). In other examples, the array 105 can be mounted in the electrical cabinet 200 using a bracket or other structural mount or frame that is separate from and not connected to the door 210. In still other examples, a single infrared sensor 115 can be employed. Thus, in operation, the thermal monitoring assembly 101 and the thermal monitoring system 100 can be employed without having to open or access the electrical panel 200.

In addition, the thermal monitoring assembly 101 can be configured to determine a position of the door 210 with respect to the interior 245 of the electrical panel 200. For example, the thermal monitoring assembly 101 (e.g. the array 105, the infrared sensor 115, or any other sensor or device) can be configured to monitor whether the door 210 of the electrical panel 200 is open or closed to ensure proper closure of safety critical equipment. Thus, the thermal monitoring assembly 101 can detect the existence of a gap or opening between the door 210 and the interior 245 of the electrical panel 200. In some instances, a gap or opening may be desirable to, for example, permit heat to escape the interior 245 of the electrical panel 200. In other examples, it may be desirable to monitor the position of the door 210 with respect to the interior 245 of the electrical panel 200 to ensure that the door 200 is closed and no atmospheric conditions (e.g. weather conditions, external heat, moisture, dirt, etc.) can enter the electrical panel 200. The electrical panel 200 can also be configured to be explosion-proof such that in the event of an explosion interior to or exterior to the electrical panel 200, the explosion can be respectively retained within the interior 245 of the electrical panel 200 or prevented from entering the interior 245 of the electrical panel 200. For the electrical panel 200 to be explosion proof, it may be desirable to determine that the door 210 is properly closed to restrict access to the interior 245 of the electrical panel 200.

In addition, by arranging the thermal monitoring system 100 on the interior portion of the door 210 of the electrical panel 200 or inside the electrical panel 200 on a frame or other structure, a thermal image of the area to be monitored 215 (e.g., the entire area 220 to be monitored) can be created irrespective of the particular electrical components 230 located within the electrical panel 200. As such, a thermal map of the contents or components of the electrical panel 200, regardless of the particular layout, orientation, configuration, or type of component within the electrical panel 200 can be obtained. The electrical panel 200 can be installed or mounted in any one or more of a variety of locations and environments where electrical components are used, including, but not limited to, commercial and residential buildings, factories, industrial plants, and other structures or locations having electrical components. The controller 300 can be configured to display the thermal image on a monitor 400 or other communication interface (e.g., computer, tablet, cellular phone, or any other electronic or visual display or screen).

The thermal monitoring system 100 includes at least one of an infrared sensor 115 and a plurality of infrared sensors 110 (shown in FIG. 2) arranged in an array 105. Each infrared sensor 115 (shown in FIG. 3) of the plurality of infrared sensors 110 has a resolution including a plurality of pixels. A controller 300 is configured to create a thermal image (shown in FIGS. 5-8) of an area to be monitored 215 based at least in part on at least one of the plurality of pixels of each infrared sensor 115 and the plurality of pixels of each infrared sensor 115 of the plurality of infrared sensors 110. The area to be monitored 215 includes an electrical component 225 located within the electrical panel 200. In another example, the area to be monitored 215 includes an entire area 220 within the electrical panel 200 including a plurality of electrical components 230 located within the electrical panel 200. In another example, the area to be monitored can include any portion and any portion size in the interior of the electrical panel, for example, the area can include a plurality of electrical components. The array 105 including the at least one of an infrared sensor 115 and the plurality of infrared sensors 110 can include any number of one or more infrared sensors 115 arranged in any pattern, orientation, or configuration. For example, a cascaded array as illustrated in FIG. 1 may be desirable for application where the area to be monitored is rectangular. However, in other applications, the array 105 can have any shape or arrangement including arrangements not explicitly disclosed herein.

In other examples, the thermal monitoring system 100 can include one or more additional sensors (schematically illustrated as additional sensors 150, in FIG. 2) including current transformers or ambient temperature sensors as well as other sensors not explicitly disclosed herein. The one or more additional sensors 150 can be associated with one or more of the plurality of infrared sensors 110 or can be disposed adjacent to or within the electrical panel 200 to sense, for example, over-current situations where one or more of the plurality of electrical components 230 is experiencing a current that is above a threshold current. An ambient temperature sensor can be used to determine a temperature of an environment in which the electrical panel 200 is employed such that a comparison or determination to differentiate whether a temperature is attributable to an overheating of one or more of the plurality of electrical components 230 or a generally increased ambient temperature from the surrounding environment. Based at least on data measured, detected, or otherwise determined by the additional sensor 150 (e.g. a temperature, a current, or other data point), the thermal monitoring system 100 can be configured to report or analyze the data to predict or diagnose a status or problem of the electrical panel.

The thermal monitoring system 100, including the one or more additional sensors 150, can therefore provide a full diagnostic assessment of the electrical panel 200 including the plurality of electrical components 230. Thus, a specific issue (e.g. over-current, excessive ambient temperature, a loose connection, a corroded or poor connection, and high resistance) can not only be detected but can be differentiated from other specific issues (e.g. over-current, excessive ambient temperature, a loose connection, a corroded or poor connection, and high resistance). Thus, unsafe or unreliable conditions within the electrical panel 200 can be identified and addressed based at least in part on the particular specific issue or issues that are detected.

It is to be understood that, while the thermal monitoring assembly 101 and thermal monitoring system 100 are described herein as being employed with respect to an electrical panel 200, other applications of thermal monitoring exist for the disclosed thermal monitoring assembly 101 and thermal monitoring system 100. For example, the thermal monitoring system 100 can be used to monitor a temperature of any object or objects that emit heat energy. Because any object with a temperature above absolute zero emits heat energy in the form of radiation, the thermal monitoring system 100 disclosed herein has a variety of applications that are within the scope of the present disclosure, including those not explicitly described herein. Moreover, it is to be understood that a wired or wireless connection between any one or more of the components disclosed herein is contemplated. For example, the controller 300 can communicate via a wired or wireless connection with the thermal monitoring system 100. Similarly, the thermal monitoring system 100 can communicate via a wired or wireless connection with the monitor 400. Such communication can occur at any distance, including remote communication transmitted over a network or other system. Any one or more of the components and features of the thermal monitoring assembly 101 including the thermal monitoring system 100 can be configured to operate manually or automatically as well as one time, periodically, or continuously.

Figure 2:
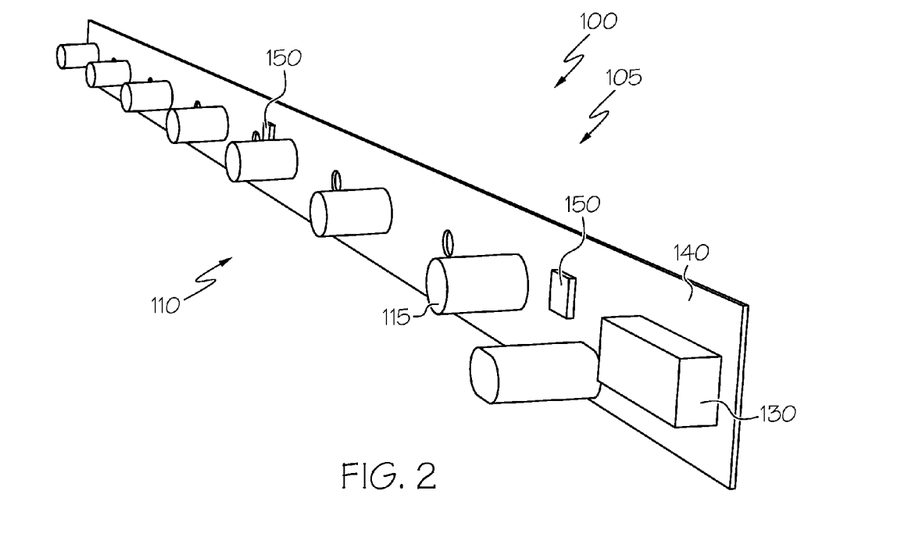
FIG. 2 is an illustration of an example infrared sensor array of a plurality of infrared sensors and one or more additional sensors in accordance with embodiments described herein.
Figure 3:
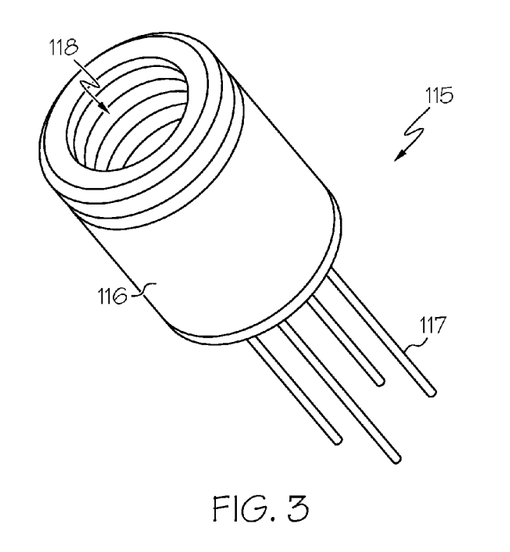
FIG. 3 is an illustration of an infrared sensor in accordance with embodiments described herein.

Turning to FIG. 2, the plurality of infrared sensors 110 of the array 105 of the thermal monitoring system 100 are shown. The infrared sensor 115 can be electronically mounted onto a circuit board 140 (e.g., printed circuit board or PCB). The circuit board 140 can include one or more additional components (e.g., a driver 130) configured to power or communicate with the plurality of infrared sensors 110 as well as electrical connections and terminals configured to electrically connect with each infrared sensor 115 of the plurality of infrared sensors 110. As shown in FIG. 3, the infrared sensor 115 includes a main body 116 that houses sensor electronics (not shown) to which terminals 117 that connect the infrared sensor 115, including the sensor electronics to the circuit board 140, are attached. The infrared sensor 115 includes a sensor face 118, which can include a lens or filter, through which infrared radiation enters. The sensor face 118, or faces in a plurality or array of sensors, preferably faces the interior of the electrical panel 200. The infrared sensor 115 detects infrared radiation emitted or reflected from an object, for example, electrical components 230 in the electrical panel.

The infrared sensor 115 can be any suitable infrared sensor known in the art or otherwise available, including those infrared sensors not explicitly disclosed herein. For example, a Melexis brand infrared sensor can include 64 pixels (e.g., 16×4 pixel resolution) and can cover a 60 degree field of view. When arranged in an array (e.g., 7 sensors wide by 1 sensor tall) a continuous 112×4 pixel resolution array can be created. Considering potential physical space limitations (e.g., inside the electrical panel 200) a field of view of the infrared sensor 115 can be approximately 3 inches. Accordingly, each infrared sensor 115 of the plurality of infrared sensors 110 arranged in an array 105 can have approximately 5×4 pixel resolution dedicated to each electrical component 225 (e.g., circuit breaker). In other examples, the specific pixel resolution dedicated to each electrical component 225 can be more or less than the specific example disclosed herein and can include other pixel resolutions including those not explicitly described herein. It is to be understood that by distributing each infrared sensor 115 of the plurality of infrared sensors 110 in an array 105 that a field of view otherwise unable to be achieved with, for example, traditional infrared cameras can be achieved. Moreover, even if a wide angle lens (e.g. an ultra-wide angle lens) were used on a traditional infrared camera, it is likely that distortion would limit resolution at the periphery of the field of view. Thus, an array 105 including a plurality of infrared sensors 110, wherein each of the infrared sensors 115 includes a plurality of pixels, can detect infrared radiation emitted or reflected from one or more objects.

The controller 300 is configured to map each of the plurality of pixels of each infrared sensor 115 of the plurality of infrared sensors 110 to a corresponding plurality of points (e.g., locations or coordinates). Each of the corresponding plurality of points is located within the area to be monitored 215 (e.g., the entire area 220 to be monitored). Furthermore, each infrared sensor 115 of the plurality of infrared sensors 110 is configured to determine a temperature (e.g., an absolute temperature or a relative temperature) at each of the corresponding plurality of points. The controller 300 is configured to create a thermal map (shown in FIGS. 5-8) of the area to be monitored 215 (e.g. the entire area 220 to be monitored) based at least in part on the temperature at each of the corresponding plurality of points.

Figure 4:
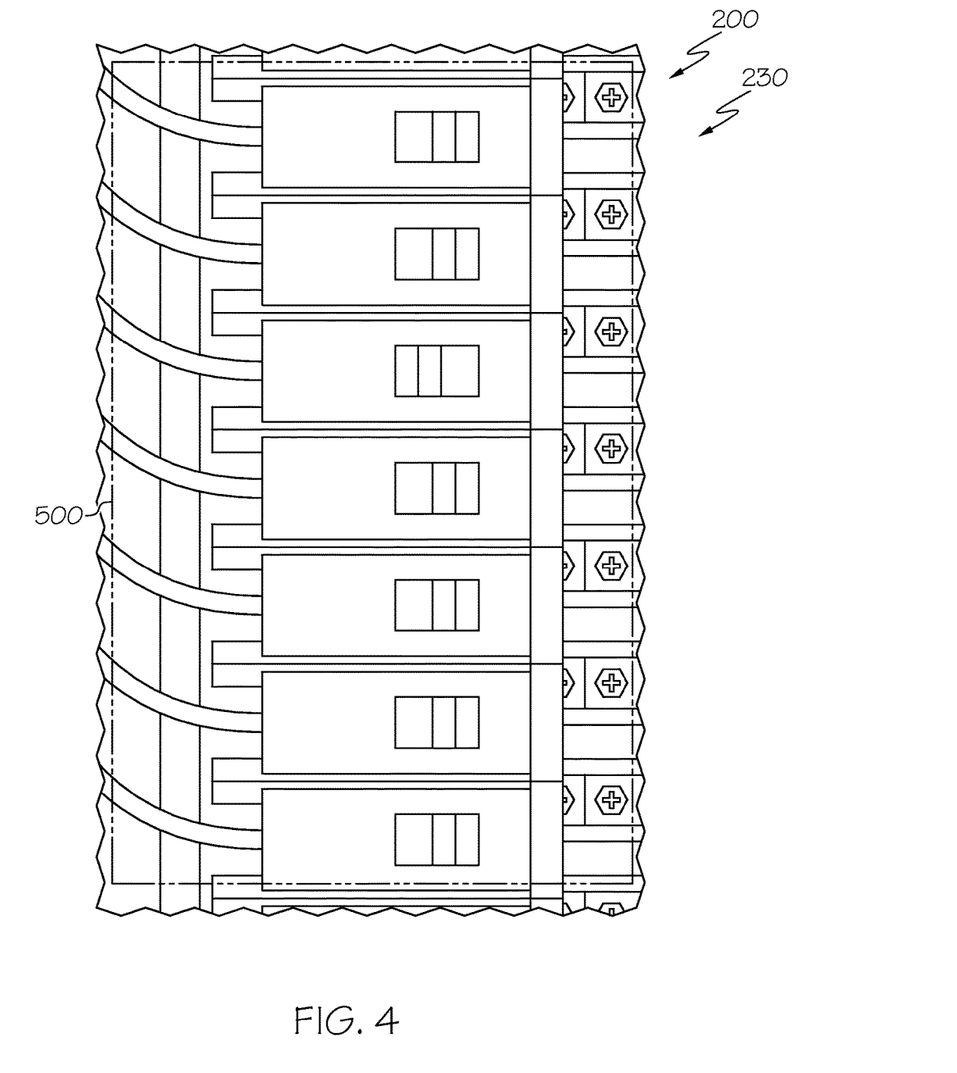
FIG. 4 is an illustration of electrical components within an electrical panel in accordance with embodiments described herein.
Figure 5:
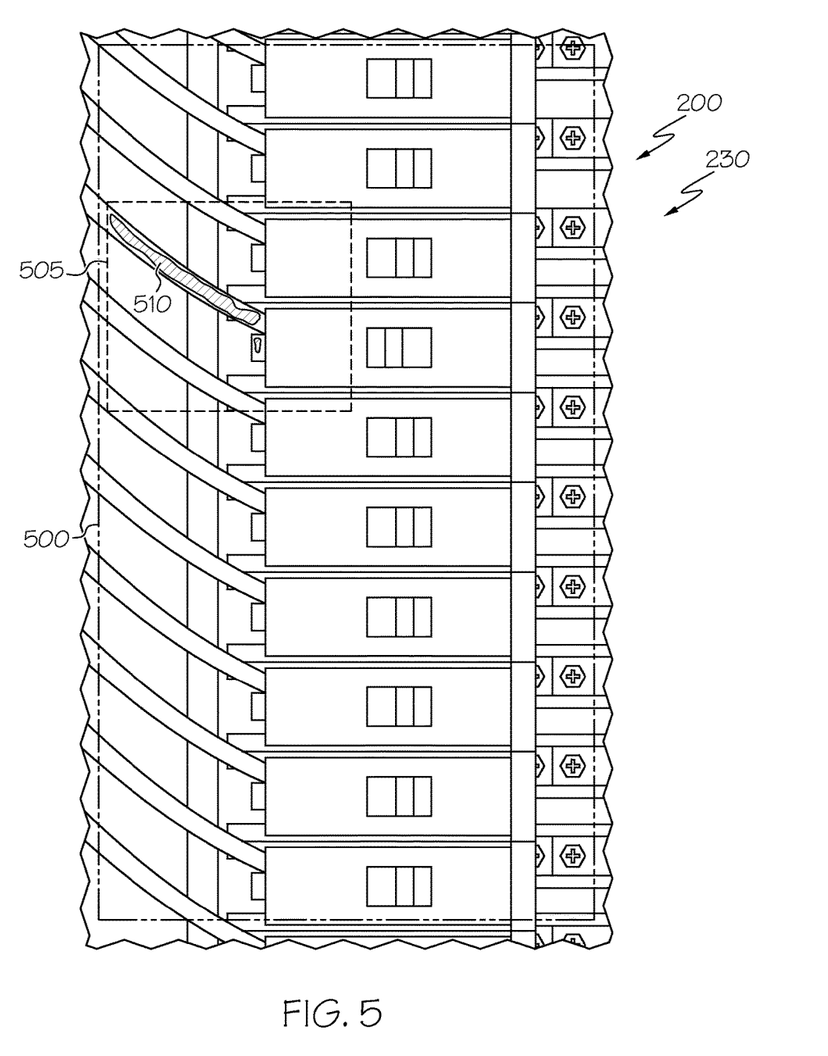
FIG. 5 is an illustration of the electrical components within an electrical panel shown in FIG. 4 having a temperature profile determined by the example infrared sensor arrays in accordance with embodiments described herein.
Figure 6:
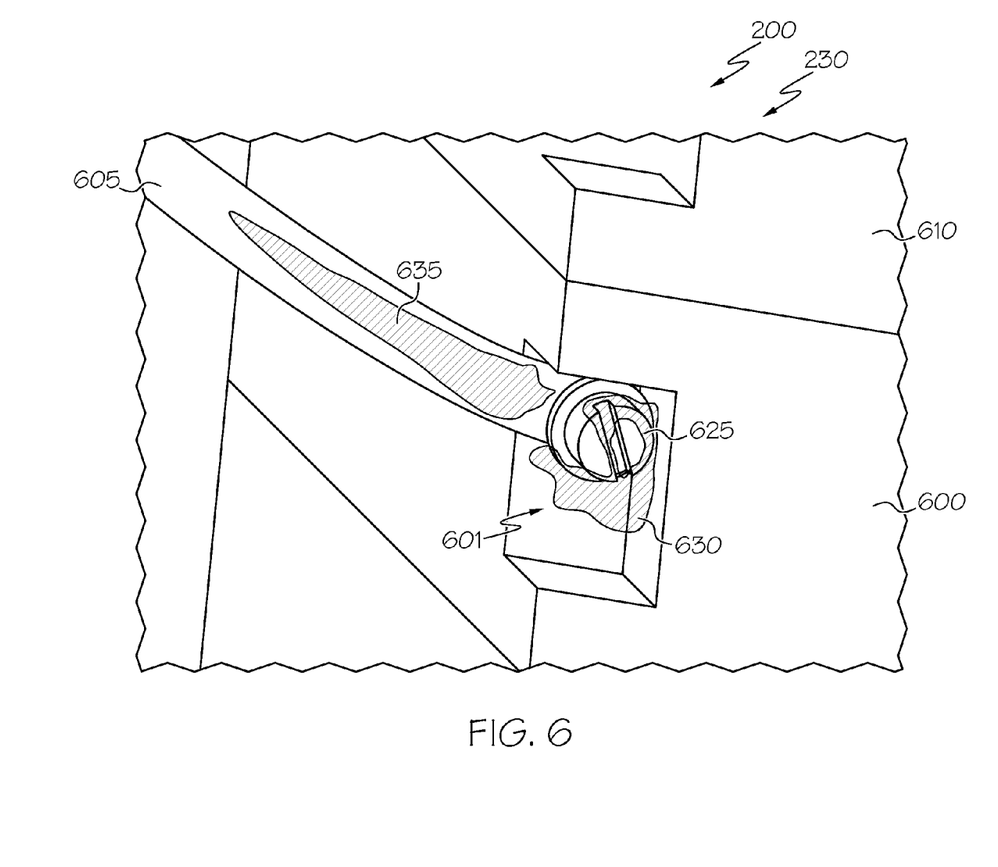
FIG. 6 is an illustration of an electrical component shown in FIG. 5 having a temperature profile determined by the example infrared sensor arrays in accordance with embodiments described herein.

As shown in FIG. 4, the plurality of electrical components 230 within the electrical panel 200 has a uniform temperature profile 500 (schematically illustrated as boundary 500). That is, the temperature at any one given point (e.g. pixel) does not exceed a threshold temperature (e.g., a temperature at which degradation to the plurality of electrical components 230 may occur) although the temperature at any one given point (e.g. pixel) may be different. Turning to FIG. 6, an increased temperature profile 505 (schematically illustrated as boundary 505) where a temperature at a particular one or more locations (e.g., location 510) is at or above the threshold temperature (e.g., a temperature at which degradation to the plurality of electrical components 230 may occur).

In other examples, the controller 300 is configured to associate the temperature at each of the corresponding plurality of points with the area to be monitored 215 (e.g., the entire area 220 to be monitored). For example, as illustrated in FIG. 6, with respect to the electrical panel 200, if a circuit breaker 600 has a loose connection 601, there can be a point of increased resistance that can cause increased or excessive heating over time. The connection can, for example, become loosened or corroded over time or can become loosened due to improper installation, maintenance, or replacement, rendering the circuit breaker 600 or the connection 601 faulty. The heat generated inside the faulty circuit breaker 600 or connection 601 will cause the circuit breaker 600 and any connected wires 605 or electrically conductive components to have a temperature that is disproportionate to (e.g., greater than) a temperature of other circuit breakers (e.g., other circuit breaker 610) within the electrical panel 200 with, for example, better electrical connections. For example, the circuit breaker 600 and any connected wires 605 or electrically conductive components can have first, second, and third temperature profiles (schematically illustrated with reference numerals 625, 630, and 635, respectively) where the first temperature profile 625 is greater than the second temperature profile 630, which is greater than the third temperature profile 635. If the disproportionate temperature or heat of the faulty circuit breaker 600, wire 605, or connection 601 can be detected, the faulty circuit breaker 600, wire 605, or connection 601 can be identified and appropriate correction (e.g., maintenance, repair, or replacement) can be performed. By periodically or continuously monitoring the plurality of electrical components 230 within the electrical panel 200, a maintenance interval with respect to the plurality of electrical components 230, can be extended, and potential safety concerns arising from faulty electrical components or connections can be corrected, prevented, or otherwise identified.

Figure 7:
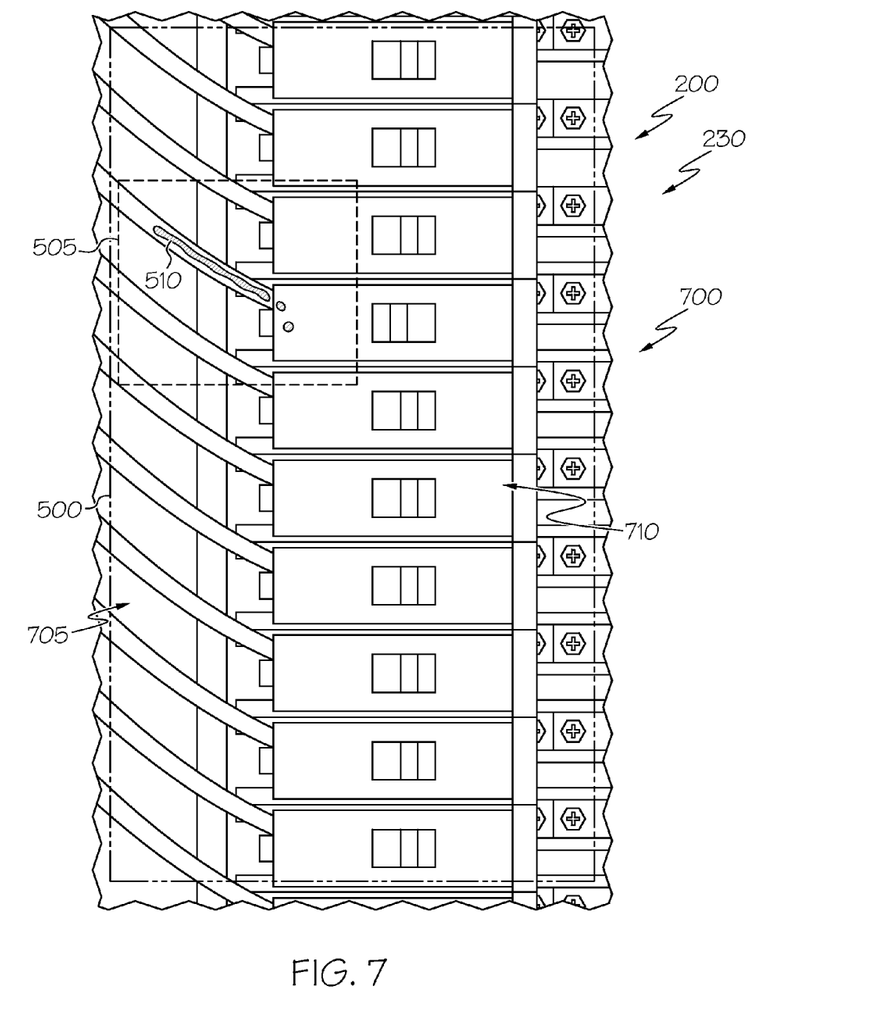
FIG. 7 is another illustration of the electrical components within an electrical panel shown in FIG. 4 having a temperature profile determined by the example infrared sensor arrays in accordance with embodiments described herein.

Turning to FIG. 7, the controller 300 is configured to create a composite thermal map 700 including a thermal image 705 and a visual representation 710 (e.g., a picture, a wireframe drawing, a block diagram, a photograph, a model, a computer or software generated image, a simplified block diagram, a graphic, rendering, schematic, or other visual or pictorial representation or depiction) of the area to be monitored 215 (e.g., the entire area 220 to be monitored). The visual representation 710 can also be generated based at least in part on a catalog, product, model, or serial number of the electrical panel 200, including a known or predetermined configuration of the plurality of electrical components 230 therein. The controller 300 is configured to digitally overlay the thermal image 705 onto the visual representation 710 of the area to be monitored 215 (e.g., the entire area 220 to be monitored).

It is to be understood that the thermal image 705 and/or data extracted from the thermal image 705 can be used individually or solely without associating the thermal image 705 and/or the data extracted from the thermal image 705 with the visual representation 710 and/or data extracted from the visual representation 710. In some examples, the visual representation 710 of the area to be monitored 215 (e.g., the entire area 220 to be monitored) includes a photograph 805 (schematically illustrated in FIG. 8) of the plurality of electrical components 230, including the electrical component 225. The controller 300 is configured to create a realistic composite thermal map 800 by digitally overlaying the thermal image 705 onto the photograph 805. In addition, the visual representation 710 of the area to be monitored 215 (e.g., the entire area 220 to be monitored) can be stored electronically within a memory of the controller 300. The controller 300 is configured to access the visual representation 710 from the memory and digitally overlay the thermal image 705 onto the visual representation 710 to produce the realistic composite thermal map 800 of the area to be monitored 215 (e.g., the entire area 220 to be monitored).

Figure 8:
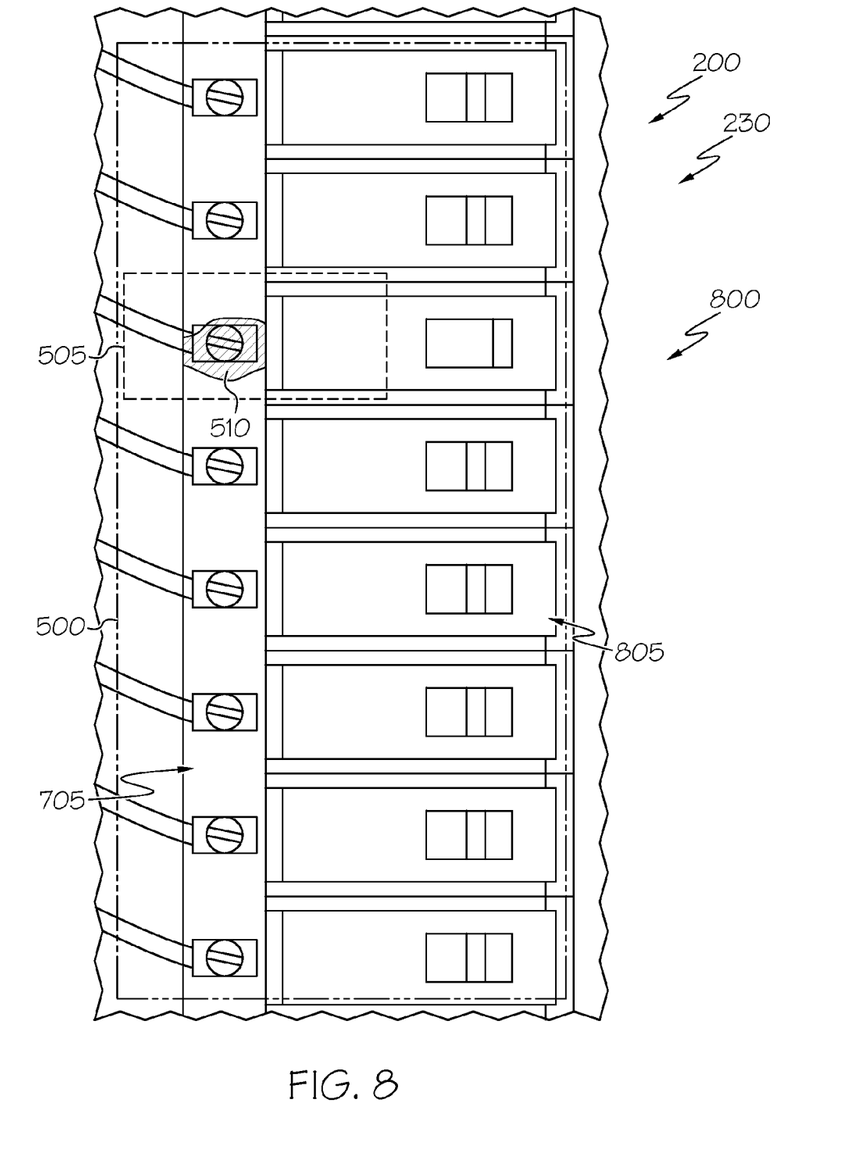
FIG. 8 is another illustration of the electrical components within an electrical panel shown in FIG. 4 having a temperature profile determined by the example infrared sensor arrays in accordance with embodiments described herein.

The photograph 805 can be a snapshot produced with a standard optical or visual-light camera. For example, the photograph 805 can be taken prior to installation of the electrical panel 200. One or more optical cameras (not shown) can be arranged inside the electrical panel 200 or integrated with one or more of each of the infrared sensors 115 of the plurality of infrared sensors 110 arrange in the array 105 and can capture one or more photographs (e.g., photograph 805) of the area to be monitored 215 (e.g., the entire area 220 to be monitored). The one or more photographs can capture structural details or other visual information associated with one or more of the plurality of electrical components 230 and can represent actual physical components present in the electrical panel 200. The visual representation 710 can provide a consistent and recognizable image upon which the thermal image 705 can be digitally overlaid.

Accordingly, by analyzing the composite thermal map 700 and/or the realistic composite thermal map 800 (e.g., looking at or digitally assessing and comparing features of the composite thermal map 700 and/or the realistic composite thermal map 800), a user (e.g., a person, computer, or other device) can identify a temperature at a single point as well as a temperature profile of one or more of a specific structural detail or other visual information associated with one or more of the plurality of electrical components 230. In other examples, a spatial or geographic coordinate of each infrared sensor 115 can be known, assigned, or otherwise determined and associated with one or more features of the thermal image 705.

In addition, the controller 300 can be configured to patch or stitch together a plurality of adjacent images from each infrared sensor 115 of the plurality of infrared sensors 110 to produce a combined thermal image from the plurality of adjacent thermal images. In some examples, the controller 300 can compensate for pixel overlap or gap between one or more of the plurality of adjacent thermal images when patching or stitching together the plurality of adjacent images to produce an improved combined thermal image. The combined thermal image is thus formed from the plurality of pixels from each infrared sensor 115 of the plurality of infrared sensors 110 arranged in an array 105. The controller 300 can be configured to perform additional manipulation or calculations with any information obtained with the one or more infrared sensors 115 of the plurality of infrared sensors 110. For example, the controller 300 can store (e.g., save) data and information, perform image processing or rendering functions to correct or enhance the thermal images, provide status alerts or warnings, disable or adjust an operation of one or more of the plurality of electrical components 230 as well as other functions including those not explicitly disclosed herein.

Moreover, although illustrated as a separate controller 300, it is to be understood that the controller could be integral to one or more of the infrared sensors 115 or to the plurality of infrared sensors 110 arranged in an array 105 as well as to the one or more additional sensors 150. Further, the controller 300 could be integral to the electrical panel 200, the monitor 400, or any other component of the thermal monitoring assembly 101 and the thermal monitoring system 100. Additionally, the controller 300 can include any one or more of a microcontroller, programmable logic controller (PLC), discrete controller, circuit, computer, or other controller.

Figure 9:
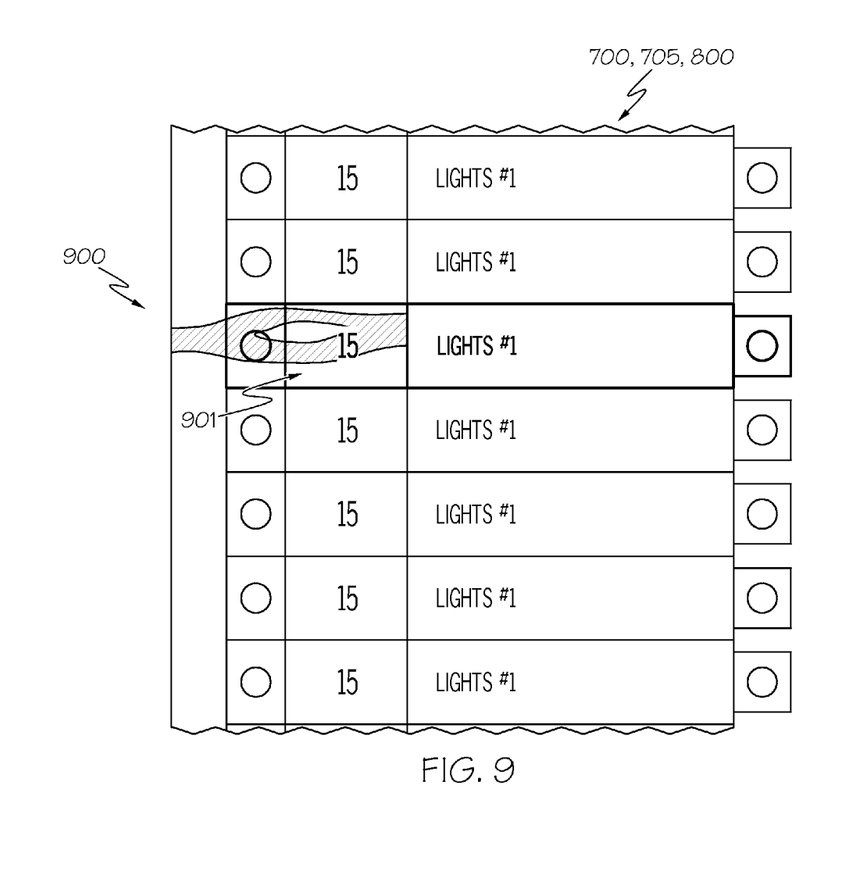
FIG. 9 is an illustration of an example user interface displaying a temperature profile of electrical components within an electrical panel in accordance with embodiments described herein.

As noted, the controller 300 can be configured to display the thermal image 705 on a monitor 400 or other communication interface. For example, as shown in FIG. 9, the controller 300 can display the thermal image (e.g., the composite thermal map 700 or the realistic composite thermal map 800) on a user interface 900 (e.g., an active, passive, or interactive userface) having a representation of the one or more electrical components identified as exceed a temperature threshold. As illustrated, a user interacting with the user interface 900 would visually see that circuit breaker 901 (corresponding to "15 Lights #1") requires attention (e.g. repair, replacement, or other maintenance).

A method of monitoring a temperature of a plurality of electrical components 230 located inside an electrical panel 200 includes providing a plurality of infrared sensors 110 arranged in an array 105 inside the electrical panel 200. Each infrared sensor 115 of the plurality of infrared sensors 110 has a resolution including a plurality of pixels. The method further includes mapping each of the plurality of pixels from each infrared sensor 115 of the plurality of infrared sensors 110 to a corresponding plurality of points. Each of the corresponding plurality of points is located within an area to be monitored 215 (e.g., an entire area 220 to be monitored). The area to be monitored 215 (e.g., the entire area 220 to be monitored) is located inside the electrical panel 200 and includes an electrical component 225 of the plurality of electrical components 230.

The method also includes determining a temperature at each of the corresponding plurality of points and creating a thermal image (shown in FIGS. 5-8) of the area to be monitored 215 (e.g., the entire area 220 to be monitored) based at least in part on the temperature at each of the corresponding plurality of points. In one example, the method includes providing an additional sensor 150 inside the electrical panel 200. The additional sensor 150 is configured to determine additional data with respect to the area to be monitored 215 (e.g., the entire area 220 to be monitored). In another example, the method includes creating a composite thermal map (shown in FIGS. 5-8) of the area to be monitored 215 (e.g., the entire area 220 to be monitored) including digitally overlaying the thermal image onto a picture of the area to be monitored. The method also includes identifying at least one of the plurality of electrical components 230 in the composite thermal map based at least in part on at least one of the temperature of at least one of the corresponding plurality of points and the additional data.

It will be apparent to those skilled in the art that various modifications and variations can be made without departing from the spirit and scope of the claimed invention.

What is claimed is:

1. A thermal monitoring system comprising:
a plurality of infrared sensors, each infrared sensor having a resolution comprising a plurality of pixels, the plurality of infrared sensors configured to monitor a cabinet having a plurality of electrical components; and
a controller configured to:
create a thermal image of a monitoring area of the cabinet based at least in part on the plurality of pixels, and
determine a characteristic of the cabinet based at least in part on the plurality of pixels,
wherein the plurality of pixels are arranged in a plurality of arrays, wherein each of the plurality of arrays is dedicated to one of the plurality of electrical components.

2. The thermal monitoring system of claim 1, further comprising: an additional sensor comprising at least one of a current transformer and an ambient temperature sensor configured to respectively determine at least one of a current and measure an ambient temperature with respect to the monitoring area.

3. The thermal monitoring system of claim 1, wherein the cabinet is an electrical panel and the plurality of infrared sensors are arranged inside the electrical panel, and wherein the monitoring area comprises the plurality of electrical components located within the electrical panel.

4. The thermal monitoring system of claim 3, wherein the monitoring area comprises an entire area within the electrical panel comprising the plurality of electrical components located within the electrical panel, and wherein the thermal image is created of the entire area based at least in part on the plurality of pixels of each of the plurality of infrared sensors.

5. The thermal monitoring system of claim 1, wherein the controller is further configured to digitally overlay the thermal image onto a visual representation of the monitoring area.

6. The thermal monitoring system of claim 5, wherein the visual representation of the monitoring area comprises at least one of a picture of the area, a wireframe drawing of the monitoring area, a block diagram of the monitoring area, and a photograph of the monitoring area.

7. The thermal monitoring system of claim 5, wherein the visual representation of the monitoring area is stored electronically within a memory of the controller, the controller being configured to access the visual representation of the monitoring area from the memory and digitally overlay the thermal image onto the visual representation of the monitoring area to produce a composite thermal map of the monitoring area.

8. The thermal monitoring system of claim 1, wherein the controller is configured to map each of the plurality of pixels of the infrared sensor to a corresponding plurality of points, wherein each of the corresponding plurality of points is located within the monitoring area.

9. The thermal monitoring system of claim 8, wherein the controller is further configured to determine a temperature at each of the corresponding plurality of points based on the plurality of pixels, and to create a thermal map of the monitoring area based at least in part on the temperature at each of the corresponding plurality of points.

10. A thermal monitoring assembly comprising:
an electrical panel comprising a plurality of electrical components located within the electrical panel;
a plurality of infrared sensors arranged in an array, wherein each of the plurality of infrared sensors has a resolution comprising a plurality of pixels and can cover at least a 60 degree field of view, and wherein the array of infrared sensors is located within the electrical panel, wherein each of the plurality of infrared sensors includes an array of pixels dedicated to monitoring one of the plurality of electrical components; and
a controller configured to:
map each of the pluralities of pixels of each of the plurality of infrared sensors to a corresponding plurality of points within a monitoring area,
determine a temperature at each of the corresponding plurality of points based on the pluralities of pixels, and
determine a characteristic of the electrical panel based at least in part on the temperature.

11. The thermal monitoring assembly of claim 10, further comprising an ambient temperature sensor configured to measure an ambient temperature with respect to the monitoring area, wherein the controller is configured to determine the characteristic further based at least in part on the ambient temperature.

12. The thermal monitoring assembly of claim 10, wherein the controller is further configured to at least one of report and analyze the characteristic to at least one of diagnose and predict at least one of a status or problem of the electrical panel.

13. The thermal monitoring assembly of claim 10, wherein the controller is configured to create a thermal image of the monitoring area based at least in part on the temperature at each of the corresponding plurality of points.

14. The thermal monitoring assembly of claim 13, wherein the controller is configured to associate the temperature at each of the corresponding plurality of points with the monitoring area, and wherein the controller is configured to create a composite thermal map comprising the thermal image and a visual representation of the monitoring area.

15. The thermal monitoring assembly of claim 14, wherein the visual representation of the monitoring area comprises a visual representation of the electrical components, and wherein the controller is configured to create the composite thermal map by digitally overlaying the thermal image onto the visual representation of the electrical components.

16. The thermal monitoring assembly of claim 13, further comprising a monitor, wherein the controller is configured to at least one of display the thermal image on the monitor and identify the characteristic on the monitor.

17. The thermal monitoring assembly of claim 10, wherein the electrical panel comprises a door configured to selectively provide and restrict access to an interior of the electrical panel, and wherein the array is arranged on at least one of the door and a frame structure inside the electrical panel such that each of the plurality of infrared sensors faces the interior of the electrical panel when the door is arranged to restrict access to the interior of the electrical panel, and wherein the thermal monitoring assembly is configured to determine a position of the door with respect to the interior of the electrical panel based at least in part on the pluralities of pixels.

18. The thermal monitoring assembly of claim 10, further comprising a current transformer configured to measure an electrical current of the plurality of electrical components with respect to the monitoring area, wherein the controller is configured to determine the characteristic further based at least in part on the electrical current.

19. The thermal monitoring assembly of claim 1, wherein the controller is configured to stitch together a plurality of adjacent images from each of the plurality of infrared sensors to produce a combined thermal image from a plurality of adjacent thermal images.

20. The thermal monitoring system of claim 1, wherein the controller creates a plurality of thermal images and is further configured to compensate for pixel overlap or gap between the plurality of thermal images when patching or stitching together adjacent thermal images to produce a combined thermal image.

\* \* \* \* \*